(12) United States Patent
Park et al.

(10) Patent No.: US 9,374,096 B2
(45) Date of Patent: Jun. 21, 2016

(54) SEMICONDUCTOR APPARATUS AND SEMICONDUCTOR SYSTEM INCLUDING THE SAME, AND METHOD OF OPERATING THE SAME

(71) Applicant: SK hynix Inc., Gyeonggi-do (KR)

(72) Inventors: Ga-Ram Park, Gyeonggi-do (KR); Jae-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 178 days.

(21) Appl. No.: 14/444,725

(22) Filed: Jul. 28, 2014

(65) Prior Publication Data
US 2015/0256184 A1    Sep. 10, 2015

(30) Foreign Application Priority Data

Mar. 5, 2014   (KR) .................. 10-2014-0025956

(51) Int. Cl.
*G11C 7/22*     (2006.01)
*H03K 21/02*    (2006.01)

(52) U.S. Cl.
CPC .............. *H03K 21/026* (2013.01); *G11C 7/222* (2013.01); *H03K 21/023* (2013.01)

(58) Field of Classification Search
CPC ........ G11C 7/22; G11C 7/222; H03K 21/023; H03K 21/026
See application file for complete search history.

(56) References Cited

U.S. PATENT DOCUMENTS

| | | | | |
|---|---|---|---|---|
| 7,209,396 B2* | 4/2007 | Schnell | ..................... | G11C 7/22 365/191 |
| 7,450,443 B2* | 11/2008 | Cheng | ..................... | G11C 7/22 327/2 |
| 7,902,887 B2* | 3/2011 | Bae | ..................... | G11C 7/22 327/147 |
| 8,917,113 B1* | 12/2014 | Song | ..................... | G01R 25/00 327/12 |
| 9,191,010 B2* | 11/2015 | Park | ..................... | G11C 7/222 |
| 9,275,711 B2* | 3/2016 | Oh | ..................... | G11C 8/18 |

FOREIGN PATENT DOCUMENTS

KR    1020120117280    10/2012

\* cited by examiner

*Primary Examiner* — Patrick O'Neill
(74) *Attorney, Agent, or Firm* — IP & T Group LLP (57) ABSTRACT

A semiconductor apparatus includes a clock division block suitable for generating a first internal clock and a second internal clock having a first phase difference at which active sections of the first internal clock and the second internal clock overlap with each other by dividing a phase of a source clock at a predetermined rate, and a phase detection block suitable for outputting detection result information generated by combining a result obtained by detecting a phase of the first internal clock at a predetermined edge of a strobe signal and a result obtained by detecting a phase of the second internal clock at the predetermined edge of the strobe signal.

20 Claims, 5 Drawing Sheets

SEMICONDUCTOR APPARATUS AND SEMICONDUCTOR SYSTEM INCLUDING THE SAME, AND METHOD OF OPERATING THE SAME

CROSS-REFERENCE TO RELATED APPLICATIONS

The present application claims priority of Korean Patent Application No. 10-2014-0025956, filed on Mar. 5, 2014, which is incorporated herein by reference in its entirety.

BACKGROUND

1. Field

Various embodiments of the present invention relate to a semiconductor design technology and, more particularly, to a semiconductor apparatus and a phase detection operation in a semiconductor system including the semiconductor apparatus.

2. Description of the Related Art

An electronic apparatus includes a variety of operation units for performing diverse operations.

As the operation rate of an electronic apparatus increases, operation signals may be applied to a number of operation units in common at the same time according to the positions where the operation units are disposed or the characteristics of signal coupling lines that are coupled with the operation units.

SUMMARY

Various embodiments of the present invention are directed to a semiconductor apparatus capable of operating in combination of divided signals, which are generated by dividing a phase of an external signal, and an internal signal whose phase is not divided.

Additionally, various embodiments of the present invention are directed to a semiconductor system including a semiconductor apparatus that may improve reliability and stability when an operation for detecting a phase difference is performed to synchronize the phase between the divided signals and the internal signal.

In accordance with an embodiment of the present invention, a semiconductor apparatus may include a clock division block suitable for generating a first internal clock and a second internal clock having a first phase difference at which active sections of the first internal clock and the second internal clock overlap with each other by dividing a phase of a source clock at a predetermined rate, and a phase detection block suitable for outputting detection result information generated by combining a result obtained by detecting a phase of the first internal clock at a predetermined edge of a strobe signal and a result obtained by detecting a phase of the second internal clock at the predetermined edge of the strobe signal.

In accordance with another embodiment of the present invention, a semiconductor system may include a controller suitable for generating and outputting a source clock and a strobe signal and variably outputting a phase of the source clock and a phase of the strobe signal based on detection result information, and a semiconductor apparatus suitable for comparing the phase of the source clock with the phase of the strobe signal and generating the detection result information corresponding to a comparison result. The semiconductor apparatus may include a clock division block suitable for generating a first internal clock and a second internal clock having a first phase difference at which active sections of the first internal clock and the second internal clock overlap with each other by dividing a phase of a source clock at a predetermined rate; and a phase detection block suitable for outputting detection result information generated by combining a result obtained by detecting a phase of the first internal clock at a predetermined edge of a strobe signal and a result obtained by detecting a phase of the second internal clock at the predetermined edge of the strobe signal.

In accordance with another embodiment of the present invention, a method of operating a semiconductor apparatus may include receiving a source clock and a strobe signal, dividing, in a phase detection operation section, a phase of the source clock at a predetermined rate to generate a first internal clock and a second internal clock having a first phase difference at which active sections of the first internal clock and the second internal clock overlap with each other, and combining a result obtained by detecting a phase of the first internal clock at a predetermined edge of the strobe signal and a result obtained by detecting a phase of the second internal clock at the predetermined edge of the strobe signal to generate detection result information.

DETAILED DESCRIPTION

Exemplary embodiments of the present invention will be described below in more detail with reference to the accompanying drawings. These embodiments are provided so that this disclosure will be thorough and complete, and will fully convey the scope of the present invention to those skilled in the art.

Figure 1:
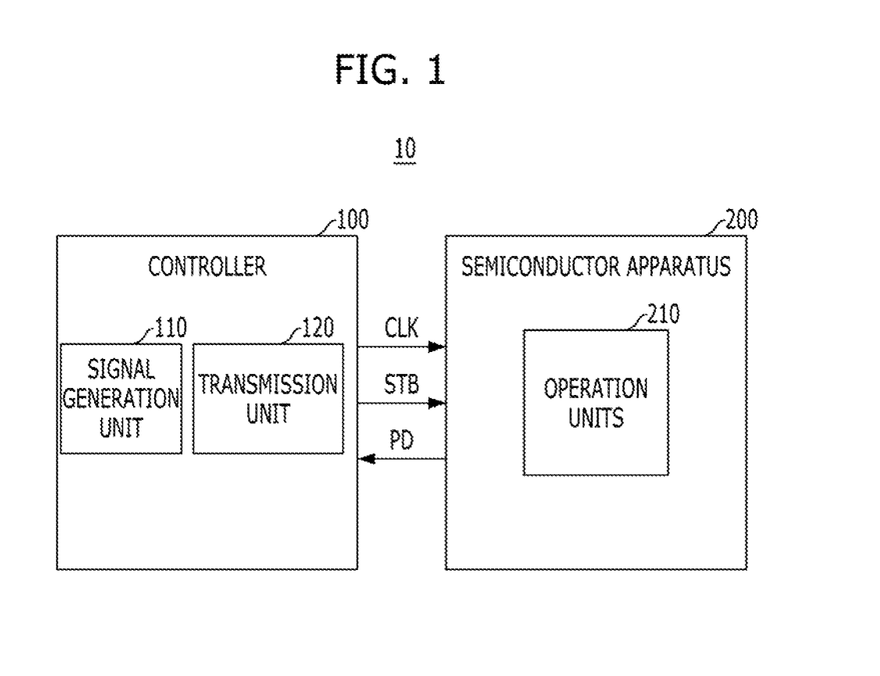
FIG. 1 is a block diagram illustrating a semiconductor system in accordance with an embodiment of the present invention.

FIG. 1 is a block diagram illustrating a semiconductor system 10 in accordance with an embodiment of the present invention.

Referring to FIG. 1, the semiconductor system 10 may include a controller 100 and a semiconductor apparatus 200.

The controller 100 generates and transmits various signals for controlling the semiconductor apparatus 200. The controller 100 may include a signal generation unit 110 and a transmission unit 120.

The signal generation unit 110 may generate a control signal. For example, the controller 100 applies a source clock CLK and a strobe signal STB to the semiconductor apparatus 200 when a phase detection operation is performed. The source clock CLK may be continuously applied to the semiconductor apparatus 200 regardless of the operation mode.

In reading about the disclosed embodiments, keep in mind the signals used are merely examples for describing the inventive concept disclosed herein. The source clock CLK may correspond to a first control signal, and the strobe signal STB may correspond to a second control signal.

The phase detection operation may include an operation for detecting a phase difference between the source clock CLK and the strobe signal STB, which are transmitted from the controller 100 to the semiconductor apparatus 200. In general, the phase detection operation is performed inside of the semiconductor apparatus 200, and detection result information PD obtained from the phase detection operation is transmitted to the controller 100.

The controller 100 may control the timing in which the source clock CLK or the strobe signal STB is activated, based on the detection result information PD applied from the semiconductor apparatus 200. Specifically, the controller 100 may control the edge timing of the source clock CLK or the strobe signal STB.

The signal generation unit 110 may control the timing in which each signal is activated and may include an encoder. The transmission unit 120 applies the signals generated from the signal generation unit 110 to the semiconductor apparatus 200.

The semiconductor apparatus 200 includes one or more operation units 210. When the semiconductor apparatus 200 includes multiple operation units 210, the operation units 210 may independently operate and may perform the same operation or different operations from each other.

The semiconductor apparatus 200 may include a memory module. The operation units 210 may include memory devices for storing data. Each of the memory devices may independently operate based on a control signal received from the controller 100. The memory devices may include volatile and/or non-volatile memory cells for storing data.

For example, the operation units 210 may receive the control signals applied from the controller 100 through multiple signal transmission lines and transmit signals to the controller 100 through the signal transmission lines.

The controller 100 transmits the control signals to the operation units 210. For example, when the operation units 210 include memory devices, the control signals may include a clock signal, command and address signals, a strobe signal, etc.

The control signals may be applied to the operation units 210 in common or individually. For example, the controller 100 and the semiconductor apparatus 200 may be included in separate chips to exchange the signals through the signal transmission lines. The control signals may be applied to the semiconductor apparatus 200 in common through one signal transmission line, and then be assigned to the respective operation units through a respective signal path in the semiconductor apparatus 200 (i.e., a common application type). Such a transmission scheme is referred to as a fly-by design.

On the other hand, the control signals may be applied to the respective operation units individually through the corresponding signal transmission lines, from the controller 100 (i.e., an individual application type).

Figure 2:
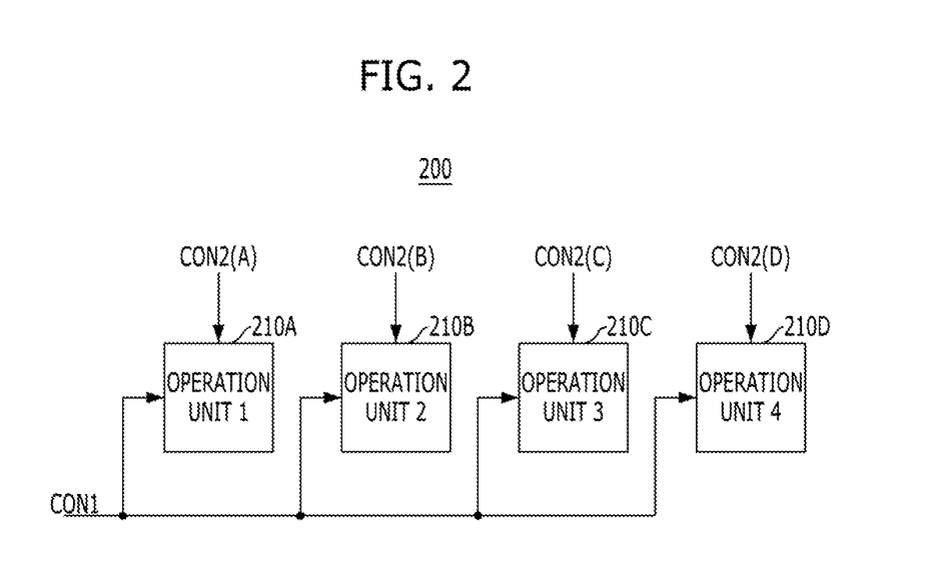
FIG. 2 is a detailed diagram of a semiconductor apparatus shown in FIG. 1.

FIG. 2 is a detailed diagram of the semiconductor apparatus 200 shown in FIG. 1, for describing the paths of the control signals applied to the respective operation units from a controller.

Referring to FIG. 2, there are two types of signals applied to a plurality of operation units 210A, 210B, 210C and 210D.

The two types of the signals may include first and second control signals CON1 and CON 2. The first control signal CON1 is commonly applied to each of the operation units 210A, 210B, 210C and 210D, and a second control signal CON2 is individually applied to each of the operation units 210A, 210B, 210C and 210D.

In addition, the second control signal CON1 is transmitted to the semiconductor apparatus 200 through a signal transmission line and a terminal (or a pin), and then it may approach the operation units 210A, 210B, 210C and 210D through the respective signal paths, which are split up inside of the semiconductor apparatus 200.

Ideally, the time taken for the first control signal CON1 to arrive in the operation units 210A, 210B, 210C and 210D is the same as the time taken for the second control signal CON2 to arrive in the operation units 210A, 210B, 210C and 210D. In this case, there is no phase difference between the first control signal CON1 and the second control signal CON2 inside of the respective operation units 210A, 210B, 210C and 210D, and even if there is a phase difference between them, the phase differences between the first control signal CON1 and the respective second control signals CON2(A) CON2(B), CON2(C) and CON2(D) are to be identical.

Since the paths where the second control signal CON2 is applied are different from each other, the delay amount of the second control signal CON2(D) applied to the fourth operation unit 210D may be larger than the delay amount of the second control signal CON2(A) applied to the first operation unit 210A. Meanwhile, the first control unit CON1 may be applied to the operation units 210A, 210B, 210C and 210D at the same time.

To improve the reliability of the operation units 210A, 210B, 210C and 210D, the first control signal CON1 and the second control signal CON2 operate with the same phase. Thus, the phases of the first control signal CON1 and the second control signal CON2 need to be synchronized.

However, since the phase difference between the first control signal CON1 and the second control signal CON2 may differ in the respective operation units 210A, 210B, 210C and 210D, the phase detection operations are to be performed on each of the operation units 210A, 210B, 210C and 210D.

The phase difference between the first control signal CON1 and the second control signal CON2 may occur due to many causes as well as the aforementioned signal paths. For example, the phase difference may occur due to signal integrity or due to reception buffer characteristics in which the first control signal CON1 and the second control signal CON2 are received in the operation units 210A, 210B, 210C and 210D, and the timing in which the phase is detected may change.

Noise, signal transit time and electromagnetic interface (EMI) may determine signal integrity. The signal integrity may vary depending on the path of the signal line in which the second control signal CON2 is applied and peripheral circuits. Also the capability to detect the second control signal CON2 of a predetermined level may change according to the characteristics of the reception buffer.

The first control signal CON1 may correspond to the source clock CLK, and the second control signal CON2 may correspond to the strobe signal STB, for example, a data strobe signal (DQS). The strobe signal STB may be a signal where a pulse is activated with predetermined timing, and the source clock CLK may be an oscillating signal having a predetermined cycle.

Figure 3:
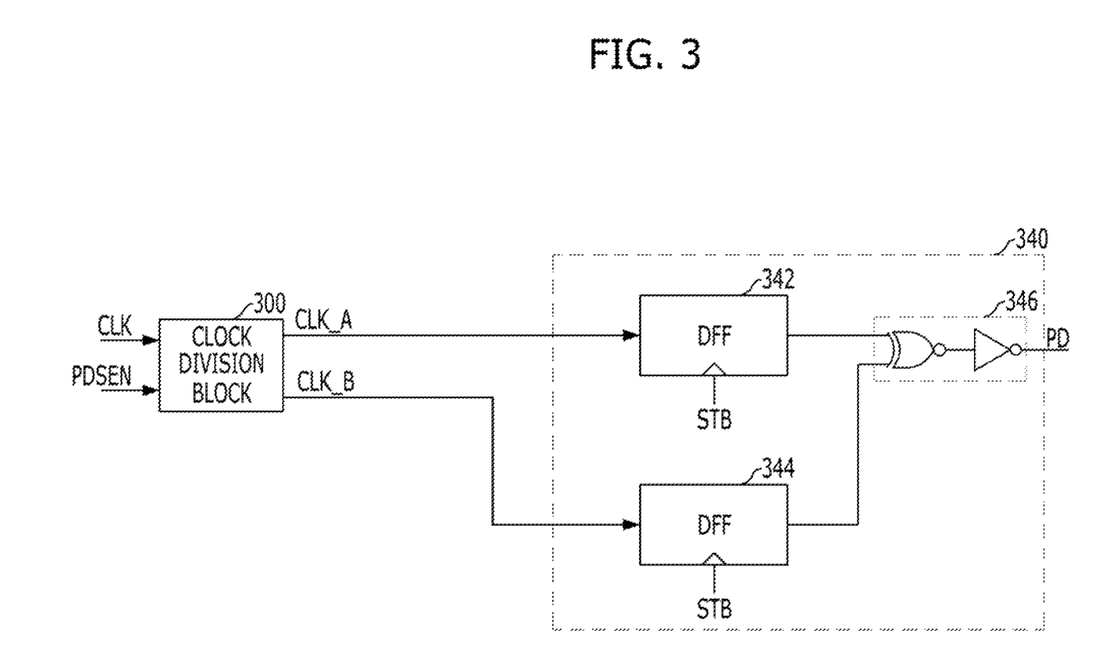
FIG. 3 illustrates a circuit for performing a phase detection operation in a semiconductor apparatus in accordance with an embodiment of the present invention.

FIG. 3 illustrates a circuit for performing a phase detection operation in the semiconductor apparatus 200 shown in FIG. 1.

Referring to FIG. 3, the circuit may include a clock division block 300 and a phase detection block 340. The phase detection block 340 may include a first phase detection unit 342, a second phase detection unit 344, and a combining unit 346.

The clock division block 300 generates a first internal clock. CLK_A and a second internal clock CLK_B having a first phase difference by dividing the phase of the source clock CLK at a predetermined rate so that their active sections overlap with each other.

Meanwhile, the strobe signal STB is inputted without being divided.

The clock division block 300 generates the first internal clock CLK_A and the second internal clock CLK_B having the first phase difference by dividing the phase of the source clock CLK at the predetermined rate so that their active sections overlap with each other only in a phase detection operation section. In a normal operation section, that is, outside the phase detection operation section, a first internal clock CLK_A and a second internal clock CLK_B, having a second phase difference measured by dividing a phase of the source clock CLK at a predetermined rate, are generated so that their active sections do not overlap with each other.

For example, the clock division block 300 generates the first internal clock CLK_A and the second internal clock CLK_B having a phase difference of approximately 90 degrees by dividing the phase of the source clock CLK at a rate of approximately ½, only in the phase detection operation section. When the first internal clock CLK_A and the second internal clock CLK_B have a phase difference of approximately 90 degrees, active sections of the first internal clock CLK_A and the second internal clock CLK_B overlap with each other. The clock division block 300 generates the first internal clock CLK_A and the second internal clock CLK_B having a phase difference of approximately 180 degrees by dividing the phase of the source clock CLK at a rate of approximately ½ in the normal operation section. When the first internal clock CLK_A and the second internal clock CLK_B have a phase difference of approximately 180 degrees, active sections of the first internal clock CLK_A and the second internal clock CLK_B do not overlap with each other.

Although a case where the clock division block 300 generates only the first internal clock CLK_A and the second internal clock CLK_B is described as an example, the present invention may be expanded to have a structure in which four or more clocks are generated by dividing the source clock CLK and two clocks among the generated clocks having a first phase difference where their active sections overlap with each other depending on the operation sections or a second phase difference where their active sections do not overlap with each other depending on an operation section. For example, the clock division block 300 generates first to fourth internal clocks (not shown) by dividing the source clock CLK at a rate of approximately ¼. The first and third internal clocks among the first to fourth internal clocks may be set to have a phase difference of approximately 90 degrees where their active sections overlap with each other or a phase difference of approximately 180 degrees where their active sections do not overlap with each other, depending on the operation sections. The second and fourth internal clocks may be set to have a phase difference of approximately 90 degrees where their active sections overlap with each other or a phase difference of approximately 180 degrees where their active sections do not overlap with each other, depending on the operation sections.

As described above, the first phase difference indicates that active sections are set to overlap with each other, and the second phase difference indicates that active sections are set not to overlap with each other. Although the aforementioned embodiment of the present invention shows that the first phase difference is a phase difference of approximately 90 degrees and the second phase difference is a phase difference of approximately 180 degrees, the present invention includes a phase difference between two corresponding signals where their active sections overlap with each other is set to be the first phase difference, and a phase difference between two corresponding signals where their active sections do not overlap with each other is set to be the second phase difference.

The phase detection operation is an operation for detecting the phase difference between the source clock CLK and the strobe signal STB. Meanwhile, the normal operation is the other operations except for the phase detection operation.

Therefore, the phase detection block 340 does not perform any operation when disabled in a normal operation section. On the other hand, the phase detection block 340 normally performs the phase detection operation when enabled in a phase detection operation section, for example, for write leveling.

A signal PDSEN, which indicates whether or not the phase detection operation section begins for the operation of the clock division block 300, is inputted to the clock division block 300. In other words, the clock division block 300 generates the first internal clock CLK_A and the second internal clock CLK_B having the first phase difference for the phase detection operation when the phase detection operation signal PDSEN is activated, and the clock division block 300 generates the first internal clock CLK_A and the second internal clock CLK_B having the second phase difference for a normal operation when the phase detection operation signal PDSEN is deactivated. Similarly, although not illustrated in the drawing, the phase detection block 340 is enabled and the phase detection operation is normally performed when the phase detection operation signal PDSEN is activated. In contrast, the phase detection block 340 is disabled and does not perform operations when the phase detection operation signal PDSEN is deactivated.

The phase detection block 340 generates detection result information PD by combining a result of detecting a phase of the first internal clock CLK_A at a predetermined edge of the strobe signal STB and a result of detecting a phase of the second internal clock CLK_B at the predetermined edge of the strobe signal STB.

The first phase detection unit 342 detects a phase of the first internal clock CLK_A at a predetermined edge of the strobe signal STB. The first phase detection unit 342 may include a D flip-flop, which transfers the first internal clock CLK_A applied to an input terminal D, in response to the predetermined edge of the strobe signal STB, to an output terminal Q.

The second phase detection unit 344 detects a phase of the second internal clock CLK_B at a predetermined edge of the strobe signal STB. The second phase detection unit 344 may include a D flip-flop, which transfers the second internal clock CLK_B applied to an input terminal D, in response to the predetermined edge of the strobe signal STB, to an output terminal Q.

The combining unit 346 outputs the detection result information PD by combining an output signal of the first phase detection unit 342 and an output signal of the second phase detection unit 344. In other words, a logic value of the detection result information PD is determined by performing an XOR operation on the output signal of the first phase detection unit 342 and the output signal of the second phase detection unit 344.

The edge, which is set in the aforementioned components and the following description, indicates a rising edge corresponding to a point in time where a corresponding signal changes from a logic 'low' level to a logic 'high' level. According to the decision of a system designer, the edge may indicate a falling edge corresponding to a point in time where a corresponding signal changes from a logic 'high' level to a logic 'low' level.

Figure 4A:
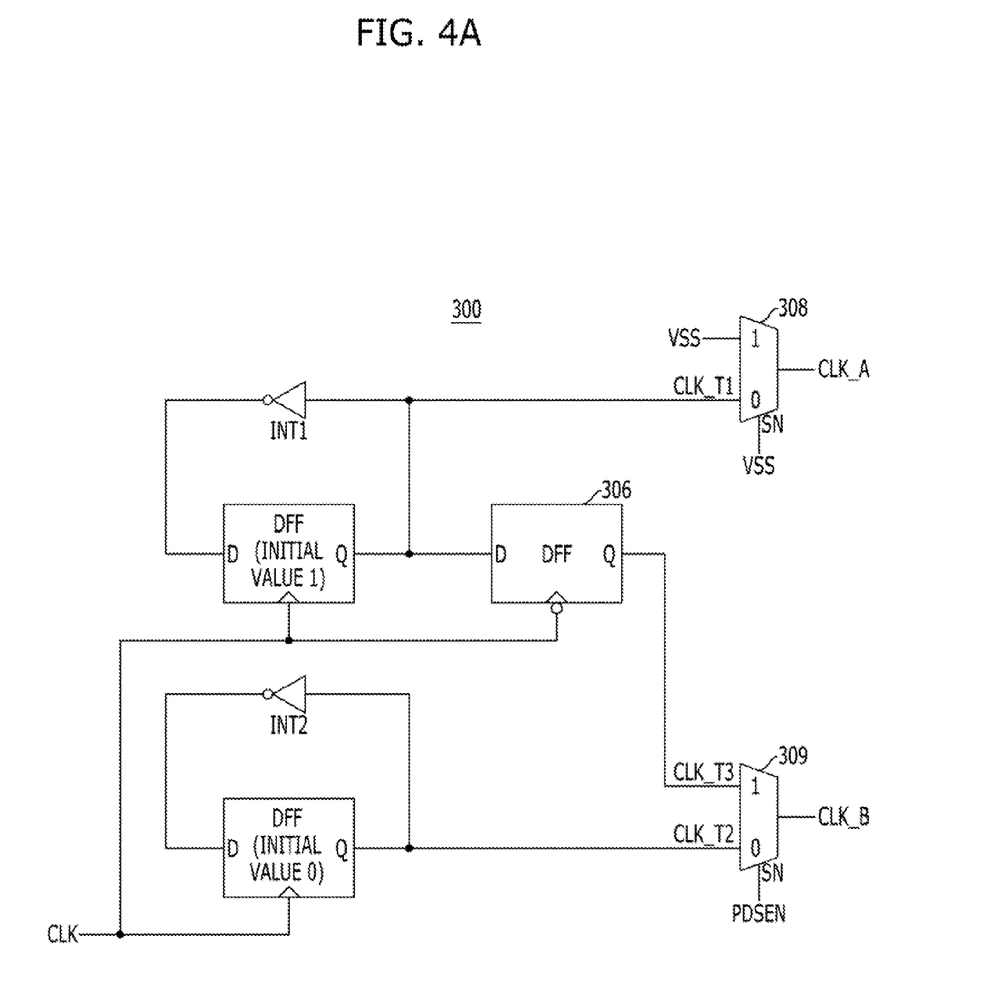
FIG. 4A is a detailed diagram of a clock division block shown in FIG. 3.

FIG. 4A is a detailed diagram of a clock division block 300 shown in FIG. 3.

Referring to FIG. 4A, the clock division block 300 includes a first preliminary clock generation unit 302, a second preliminary clock generation unit 304, a third preliminary clock generation unit 306, a first internal clock output unit 308 and a second internal clock output unit 309.

The first preliminary clock generation unit 302 generates a first preliminary clock CLK_T1 where first and second edges are alternately generated starting from the first edge at every first edge of the source clock CLK. The first preliminary clock generation unit 302 may include a D flip-flop, which transfers a value of an input terminal D to an output terminal Q in response to the first edge of the source clock CLK. A first inverter INT1 is disposed between the input terminal D and the output terminal Q of the first preliminary clock generation unit 302, and so the first preliminary clock generation unit 302 generates the first preliminary clock CLK_T1, which has an inverted value, whenever the first edge of the source clock CLK is generated. In other words, the first preliminary clock CLK_T1 is generated by dividing the source clock CLK at a rate of approximately ½ through the operations of the first preliminary clock generation unit 302 and the first inverter INT1.

The second preliminary clock generation unit 304 generates a second preliminary clock CLK_T2 where second and first edges are alternately generated starting from the second edge at every first edge of the source clock CLK. The second preliminary clock generation unit 304 may include a D flip-flop, which transfers a value of an input terminal D to an output terminal Q in response to the first edge of the source clock CLK. A second inverter INT2 is disposed between the input terminal D and the output terminal Q of the second preliminary clock generation unit 304, and so the second preliminary clock generation unit 304 generates the second preliminary clock CLK_T2 that has an inverted value whenever the first edge of the source clock CLK is generated. In other words, the second preliminary clock CLK_T2 is generated by dividing the source clock CLK at a rate of approximately ½ through the operations of the second preliminary clock generation unit 304 and the second inverter INT2.

The first preliminary clock generation unit 302 and the second preliminary clock generation unit 304 have initial output values which are opposite to one another. For example, as shown in the drawing, when a value of the output terminal Q of the first preliminary clock generation unit 302 becomes '1' in response to the first edge of the source clock CLK, and the first edge of the first preliminary clock CLK_T1 is generated, a value of the output terminal Q of the second preliminary clock generation unit 304 becomes '0', and the second edge of the second preliminary clock CLK_T2 is set to be generated. Different from what is shown in the drawing, when a value of the output terminal Q of the first preliminary clock generation unit 302 becomes '0' in response to the first edge of the source clock CLK, and the second edge of the first preliminary clock CLK_T1 is generated, a value of the output terminal Q of the second preliminary clock generation unit 304 becomes '1', and the first edge of the second preliminary clock CLK_T2 is set to be generated. In short, the first preliminary clock CLK_T1, generated from the first preliminary clock generation unit 302, and the second preliminary clock CLK_T2, generated from the second preliminary clock generation unit 304 in response to the source clock CLK, are set to have a phase difference of approximately 180 degrees between each other all the time.

The third preliminary clock generation unit 306 generates a third preliminary clock CLK_T3 by shifting the first preliminary clock CLK_T1 based on the timing in which the second edge of the source clock CLK is generated. The third preliminary clock generation unit 306 may include a D flip-flop, which transfers a value of an input terminal D to an output terminal Q in response to the second edge of the source clock CLK. The first preliminary clock CLK_T1 of which a logic value transitions whenever the first edge of the source clock CLK is generated is applied to the input terminal D of the third preliminary clock generation unit 306, and the third preliminary clock generation unit 306 transfers the value of the input terminal D to the output terminal Q whenever the second edge of the source clock CLK is generated. Therefore, the third preliminary clock CLK_T3, outputted through the output terminal Q of the third preliminary clock generation unit 306, may be in a state where a phase of the first preliminary clock CLK_T1 is shifted by a phase difference between the first edge and the second edge of the source clock CLK. Since the first internal clock CLK_A and the second internal clock CLK_B are generated by dividing the source clock CLK at a rate of approximately ½, the first preliminary clock CLK_T1 and the third preliminary clock CLK_T3 have a phase difference of approximately 90 degrees through an operation of the first preliminary clock generation unit 302.

The first internal clock output unit 308 outputs the first preliminary clock CLK_T1 as the first internal clock CLK_A in the phase detection operation section and the normal operation section. The first internal clock output unit 308 is a multiplexer, and a ground voltage VSS terminal is coupled with a selection terminal SN, and the first preliminary clock CLK_T1 is applied to a first input node 0, and the ground voltage VSS terminal is coupled with a second input node 1. The first input node 0 is always selected corresponding to the ground voltage VSS applied to the selection terminal SN. Therefore, the first preliminary clock CLK_T1 applied to the first input node 0 through an operation of the first internal clock output unit 308 is always outputted as the first internal clock CLK_A.

The second internal clock output unit 309 outputs the third preliminary clock CLK_T3 as the second internal clock CLK_B in the phase detection operation section and the second preliminary clock CLK_T2 as the second internal clock CLK_B in the normal operation section. The second internal clock output unit 309 is a multiplexer, and the phase detection operation signal PDSEN is applied to the selection terminal SN, and the second preliminary clock CLK_T2 is applied to the first input node 0, and the third preliminary clock CLK_T3 is applied to the second input node 1. The phase detection operation signal PDSEN, applied to the selection terminal SN selects the second input node 1 by activating to a logic 'high' level in the phase detection operation section and the first input node 0 by deactivating to a logic 'low' level in the normal operation section. Therefore, the third preliminary clock CLK_T3 is outputted as the second internal clock CLK_B through the operation of the second internal clock output unit 309 in the phase detection operation section, and the second preliminary clock CLK_T2 is outputted as the second internal clock CLK_B through the operation of the second internal clock output unit 309 in the normal operation section.

To sum up the operations of the clock division block 300, the first internal clock CLK_A and the second internal clock CLK_B are generated by dividing the source clock CLK at a rate of approximately ½ regardless of the phase detection operation section or the normal operation section. Therefore, the frequency of the source clock CLK is twice as high as the frequencies of the first internal clock CLK_A and the second internal clock CLK_B.

Also, the first internal clock CLK_A and the second internal clock CLK_B may have a phase difference of approximately 90 degrees so that their active sections are set to overlap with each other in the phase detection operation section, and the first internal clock CLK_A and the second internal clock CLK_B may have a phase difference of approximately 180 degrees so that their active sections are set not to overlap with each other in the normal operation section.

The first edge, which is set in the aforementioned components and the following description, indicates a rising edge corresponding to a point in time where a corresponding signal transitions from a logic 'low' level to a logic 'high' level. When the first edge is the rising edge, the second edge indicates a falling edge. Depending on the design, the first edge may be the falling edge corresponding to a point in time where a corresponding signal transitions from a logic 'high' level to a logic 'low' level. When the first edge is the falling edge, the second edge becomes the rising edge.

Figure 4B:
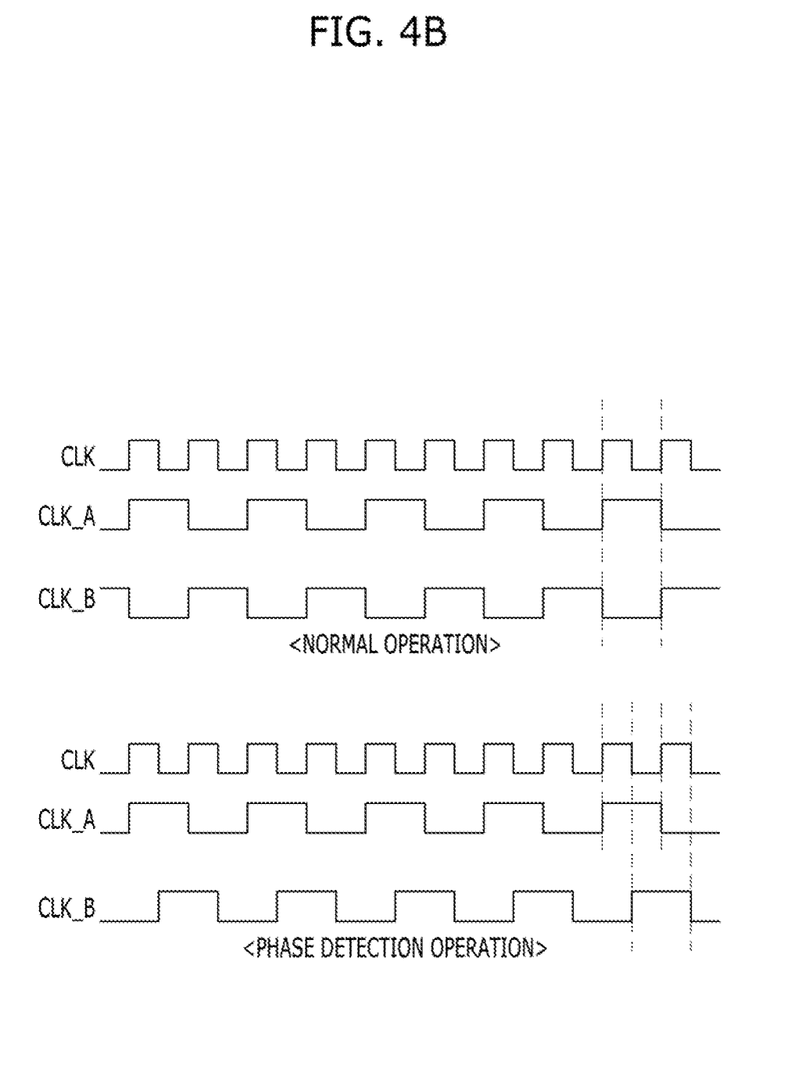
FIG. 4B is a timing diagram for describing the operations of the clock division block shown in FIG. 4A.

FIG. 4B is a timing diagram for describing the operations of the clock division block 300 shown in FIG. 4A.

Referring to FIG. 4B, the clock division block 300 shown in FIG. 4A generates the first internal clock CLK_A and the second internal clock CLK_B by dividing the source clock CLK at a rate of approximately ½. In other words, FIG. 4B shows that the frequency of the source clock CLK is twice as high as the frequencies of the first internal clock CLK_A and the second internal clock CLK_B.

Also, FIG. 4B shows that the first internal clock CLK_A and the second internal clock CLK_B have a phase difference of approximately 180 degrees in the normal operation section.

In addition, FIG. 4B shows that the first internal clock CLK_A and the second internal clock CLK_B have a phase difference of approximately 90 degrees in the phase detection operation section.

Figure 5:
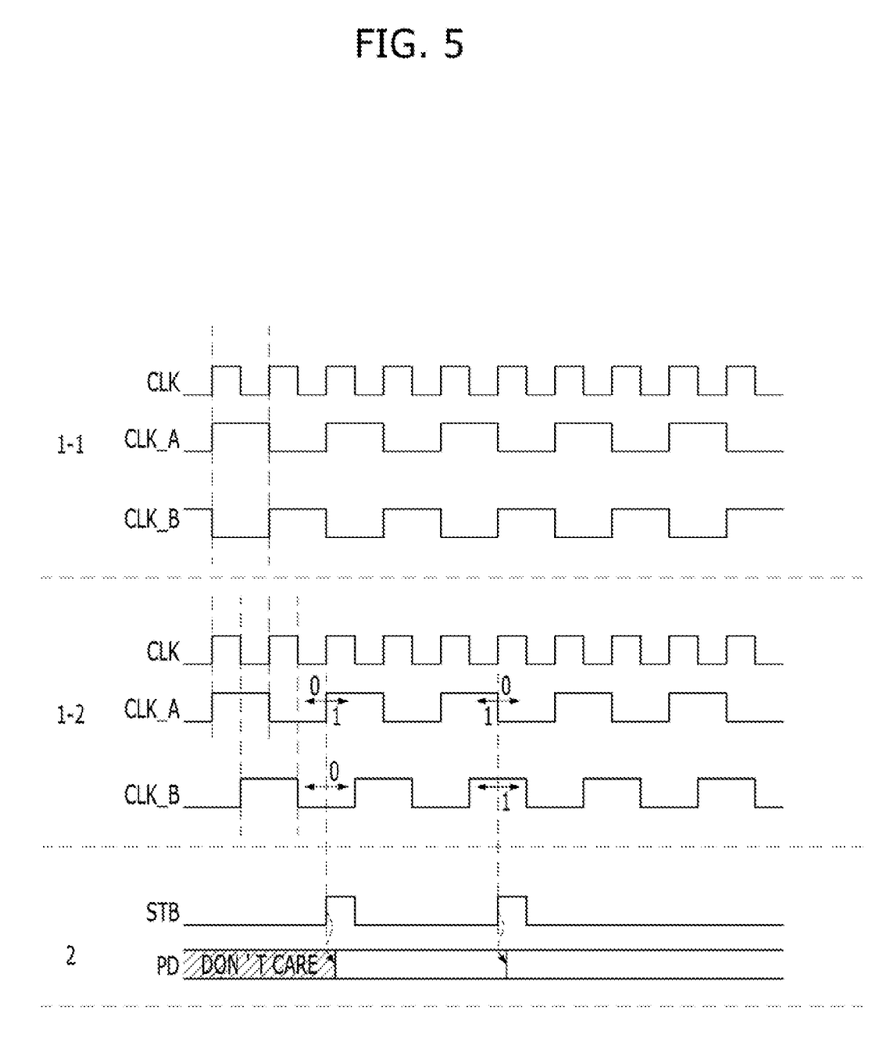
FIG. 5 is a timing diagram for describing an operation of the circuit shown in FIG. 3.

FIG. 5 is a timing diagram for describing an operation of the circuit shown in FIG. 3.

Referring to FIG. 5 an operation of the circuit shown in FIG. 3 is divided into operations 1-1 and 1-2 of the clock division block 300 and an operation 2 of the phase detection block 340.

As shown in the operations 1-1 and 1-2 of the clock division block 300, the first internal clock CLK_A and the second internal clock CLK_B are generated by dividing the source clock CLK at a rate of approximately ½. In other words, the frequency of the source clock CLK is twice as high as the frequencies of the first internal clock CLK_A and the second internal clock CLK_B.

In the normal operation section 1-1, the first internal clock CLK_A and the second internal clock CLK_B have an approximately 180 degree phase difference. Since the operation of the clock division block 300 in the normal operation section 1-1 is not related to the phase detection operation, the operation 1-2 of the clock division block 300 and the operation 2 of the phase detection block 340 in the subsequent phase detection operation section 1-2 are not related to each other.

In the phase detection operation section 1-2, the first internal clock CLK_A and the second internal clock CLK_B have a phase difference of approximately 90 degrees. Therefore, the rising edge of the first internal clock CLK_A is generated in a section where the second internal clock CLK_B has a value of '0', and the falling edge of the first internal clock CLK_A is generated in a section where the second internal clock CLK_B has a value of '1'.

As described above, while the source clock CLK is inputted by being divided into the first internal clock CLK_A and the second internal clock CLK_B, the strobe signal STB is inputted without being divided.

The strobe signal STB is a signal, which is inputted to be synchronized with the rising edge of the source clock CLK. Therefore, the rising edge of the strobe signal STB is to be synchronized with the rising edge of the source clock CLK. As shown in the drawing, when the strobe signal STB is inputted at 3 cycles '3tck' of the source clock CLK, the rising edge of the strobe signal STB, which is inputted at the odd-number time is to be synchronized with the rising edge of the first internal clock CLK_A, and the rising edge of the strobe signal STB, which is inputted at the even-number time to be synchronized with the falling edge of the first internal clock CLK_A. Different from what is shown in the drawing, according to the method in which the strobe signal STB is inputted, the rising edge of the strobe signal STB may be inputted to be synchronized with the rising edge of the first internal clock CLK_A all the time or the falling edge of the first internal clock CLK_A all the time. Also, the rising edge of the strobe signal STB, which is inputted at the odd-number time may be inputted to be synchronized with the falling edge of the first internal clock CLK_A, and the rising edge of the strobe signal STB, which is inputted at the even-number time may be inputted to be synchronized with the rising edge of the first internal clock CLK_A. In other words, when the rising edge of the strobe signal STB is sure to be inputted to be synchronized with the rising edge of the source clock CLK, there is no way to know in advance how the first internal clock CLK_A, the second internal clock CLK_B and the strobe signal STB are generated. In the drawing, the first and second internal clocks CLK_A and CLK_B are generated in such a manner that the rising edge of the first internal clock CLK_A is synchronized with the rising edge of the source clock CLK, and the second internal clock CLK_B is synchronized with the falling edge of the source clock CLK. However, this is just one exemplary embodiment, and the opposite case is possible. When the first and second internal clocks CLK_A and CLK_B are generated as in the opposite case, the operations of the first internal clock CLK_A and the second internal clock CLK_B may change in reverse.

As shown in the operation 2 of the phase detection block 340, detection result information PD is generated by combining a result of detecting a phase of the first internal clock CLK_A at the rising edge of the strobe signal STB and a result of detecting a phase of the second internal clock CLK_B at the rising edge of the strobe signal STB.

To be specific, as the result of detecting the phase of the first internal clock CLK_A respectively at the rising edge of the odd-numbered strobe signal STB and the rising edge of the even-numbered strobe signal STB, opposite values are detected due to a difference between an input period of the strobe signal STB and an input period of the source clock CLK.

For example, when the phase of the strobe signal STB is slightly ahead of the phase of the source clock CLK, the first internal clock CLK_A has a value of '0' at the rising edge of the odd-numbered strobe signal STB, and the first internal clock CLK_A has a value of '1' at the rising of the even-numbered strobe signal STB.

In contrast, when the phase of the strobe signal STB is slightly behind the phase of the source clock CLK, the first internal clock CLK_A has a value of '1' at the rising edge of the odd-numbered strobe signal STB, and the first internal clock CLK_A has a value of '0' at the rising edge of the even-numbered strobe signal STB.

The phase detection results of the first internal clock CLK_A, which are detected at each rising edge of the odd-numbered strobe signal STB, and the even-numbered strobe signal STB have opposite values. Since there is no way to know whether the detected values are detected adjacent to the rising edge of the first internal clock. CLK_A or those are detected adjacent to the falling edge of the first internal clock CLK_A even though the results have opposite values, it may not be decided whether the value of the first internal clock CLK_A detected at the rising edge of the odd-numbered strobe signal STB is correct or the value of the first internal clock CLK_A detected at the rising edge of the even-numbered strobe signal STB is correct. For this reason, in the embodiment of the present invention, whether the value of the first intern& clock CLK_A detected at the rising edge of the strobe signal STB is a value adjacent to the rising edge or a value adjacent to the falling edge may be determined by using the second internal clock CLK_B having a phase delayed by approximately 90 degrees from the phase of the first internal clock CLK_A.

Such a determination is possible because the second internal clock CLK_B has a phase delayed by approximately 90 degrees from the phase of the first internal clock CLK_A. In other words, this is because the rising edge of the first internal clock CLK_A is always generated in a section where the second internal clock CLK_B has a value of '0', and the falling edge of the first internal clock CLK_A is always generated in a section where the second internal clock CLK_B has a value of '1'. As a result, when the second internal clock CLK_B detected at the rising edge of the odd-numbered strobe signal STB or the rising edge of the even-numbered strobe signal STB has a value of '0', it may be seen that the first internal clock CLK_A adjacent to the rising edge of the odd-numbered strobe signal STB or the rising edge of the even-numbered strobe signal STB is the rising edge. When the second internal clock CLK_B detected at the rising edge of the odd-numbered strobe signal STB or the rising edge of the even-numbered strobe signal STB has a value of '1', it may be seen that the first internal clock CLK_A adjacent to the rising edge of the odd-numbered strobe signal STB or the rising edge of the even-numbered strobe signal STB is the falling edge.

For example, when the phase of the strobe signal STB is slightly ahead of a phase of the source clock CLK, the first internal clock CLSK_A has a value of '0', and the second internal clock CLK_B has a value of '0' at the rising edge of the odd-numbered strobe signal STB. The value obtained by performing an XOR operation to combine the two values becomes '0'. Also, the first internal clock CLK_A has a value of '1', and the second internal clock CLK_B has a value of '1' at the rising edge of the even-numbered strobe signal STB. The value obtained by performing an XOR operation to combine the two values becomes '0'.

Although the first internal clock CLK_A adjacent to the rising edge of the odd-numbered strobe signal STB is the rising edge, and the first internal clock CLK_A adjacent to the rising edge of the even-numbered strobe signal STB is the falling edge, a result of '0' may be identically derived through combination with the second internal clock CLK_B. Also, it may be seen that the phase of the strobe signal STB is ahead of the phase of the source clock CLK through the result of '0'.

In contrast, when the phase of the strobe signal STB is slightly behind a phase of the source clock CLK, the first internal clock CLK_A has a value of '1', and the second internal clock CLK_B has a value of '0' at the rising edge of the odd-numbered strobe signal STB. The value obtained by performing an XOR operation to combine the two values becomes '1'. Also, the first internal clock CLK_A has a value of '0', and the second internal clock CLK_B has a value of '1' at the rising edge of the even-numbered strobe signal STB. The value obtained by performing an XOR operation to combine the two values becomes '1'.

Although the first internal clock CLK_A adjacent to the rising edge of the odd-numbered strobe signal STB is the rising edge, and the first internal clock CLK_A adjacent to the rising edge of the even-numbered strobe signal STB is the falling edge, a result of '1' may be identically derived through a combination with the second internal clock CLK_B. Also, it may be seen that the phase of the strobe signal STB is behind the phase of the source clock CLK through the result of '2'.

Although the XOR operation is performed to combine the value of the first internal clock CLK_A and the value of the second internal clock CLK_B detected at the rising edge of the odd-numbered strobe signal STB or the rising edge of the even-numbered strobe signal STB in the embodiment of the present invention, this is just one exemplary embodiment, and another method may be used according to the decisions of a system designer.

Exemplary embodiments of the present invention are directed to a semiconductor apparatus, which operates in combination of a divided signal generated by dividing a phase of an external signal transitioning at high speed and an internal signal in which the phase is not divided. When an operation for detecting a phase difference is performed for a phase synchronization between the divided signal and the internal signal, a phase detection operation is performed by using a method that samples a logic value at an edge, not a method that compares an edge between the divided signal and the internal signal with a phase of the edge, so that the reliability and stability of the phase detection operation may improve.

Also, an accurate phase detection result may be derived regardless of whether the reverse of the phase occurs in the process of generating the divided signal.

In accordance with the embodiments of the present invention as described above, among a source clock CLK and a strobe signal STB transitioning at high speed, a semiconductor apparatus is operated based on a first internal clock CLK_A and a second internal clock CLK_B generated by dividing a phase of the source clock CLK, and the strobe signal STB of which a phase is not divided. When an operation for detecting a phase difference between the first and second internal clocks CLSK_A and CLK_B and the strobe signal STB is performed, the first internal clock CLK_A and the second internal clock. CLK_B are set to have a phase difference of approximately 90 degrees. Subsequently, a method where a phase detection result is derived by combining the values obtained from detecting the phase difference between the strobe signal STB and the first and second internal clocks CLSK_A and CLK_B is used.

Since a method that samples a logic value at an edge, not a method that compares an edge with a phase of the edge, is used, the reliability and stability of the phase detection operation may improve.

Also, an accurate phase detection result may be derived regardless whether the reverse of the phase occurs in the process of generating the first and second internal clocks CLSK_A and CLK_B by dividing the phase of the source clock CLK.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor apparatus, comprising:
   a clock division block suitable for generating a first internal clock and a second internal clock having a first phase difference at which active sections of the first internal clock and the second internal clock overlap with each other by dividing a phase of a source clock at a predetermined rate; and
   a phase detection block suitable for outputting detection result information generated by combining a result obtained by detecting a phase of the first internal clock at a predetermined edge of a strobe signal and a result obtained by detecting a phase of the second internal clock at the predetermined edge of the strobe signal.

2. The semiconductor apparatus of claim 1, wherein the clock division block generates the first internal clock and the second internal clock having the first phase difference at which the active sections of the first internal clock and the second internal clock overlap with each other by dividing the phase of the source clock at the predetermined rate in a phase detection operation section, and a first internal clock and a second internal clock having a second phase difference at which active sections of the first internal clock and the second internal clock do not overlap with each other by dividing the phase of the source clock at the predetermined rate in a normal operation section.

3. The semiconductor apparatus of claim 2, wherein the clock division block includes:
   a first preliminary clock generation unit for generating a first preliminary clock where first and second edges are alternately generated starting from the first edge at every first edge of the source clock;
   a second preliminary clock generation unit for generating a second preliminary clock where second and first edges are alternately generated starting from the second edge at every first edge of the source clock;
   a third preliminary clock generation unit for generating a third preliminary clock by shifting the first preliminary clock based on a timing in which the second edge of the source clock is generated;
   a first internal clock output unit for outputting the first preliminary clock as the first internal clock in the phase detection operation section and the normal operation section; and
   a second internal clock output for outputting the third preliminary clock as the second internal clock in the phase detection operation section and the second preliminary clock as the second internal clock in the normal operation section.

4. The semiconductor apparatus of claim 2, wherein the phase detection block is enabled in the phase detection operation section, and disabled in the normal operation section.

5. The semiconductor apparatus of claim 2, wherein the first phase difference is a phase difference of approximately 90 degrees, and the second phase difference is a phase difference of approximately 180 degrees.

6. The semiconductor apparatus of claim 2, wherein the predetermined rate is approximately ½, and a frequency of the source clock is twice as high as frequencies of the first and second internal clocks.

7. The semiconductor apparatus of claim 2, wherein the phase detection block includes:
   a first phase detection unit for detecting the phase of the first internal clock at the predetermined edge of the strobe signal;
   a second phase detection unit for detecting the phase of the second internal clock at the predetermined edge of the strobe signal; and
   a combining unit for outputting the detection result information by performing an XOR operation on an output signal of the first phase detection unit and an output signal of the second phase detection unit.

8. The semiconductor apparatus of claim 1, wherein the strobe signal is inputted with a fixed phase regardless of the detection result information, and the strobe signal is inputted with a varying phase adjusted in response to the detection result information.

9. The semiconductor apparatus of claim 1, wherein the source clock is inputted with a fixed phase regardless of the detection result information, and the source clock is inputted with a varying phase adjusted in response to the detection result information.

10. A semiconductor system, comprising:
    a controller suitable for generating and outputting a source clock and a strobe signal and variably outputting a phase of the source clock and a phase of the strobe signal based on detection result information; and
    a semiconductor apparatus suitable for comparing the phase of the source clock with the phase of the strobe signal and generating the detection result information corresponding to a comparison result,
    wherein the semiconductor apparatus includes:
      a clock division block suitable for generating a first internal clock and a second internal clock having a first phase difference at which active sections of the first internal clock and the second internal clock overlap with each other by dividing a phase of a source clock at a predetermined rate; and
      a phase detection block suitable for outputting detection result information generated by combining a result obtained by detecting a phase of the first internal clock at a predetermined edge of a strobe signal and a result obtained by detecting a phase of the second internal clock at the predetermined edge of the strobe signal.

11. The semiconductor system of claim 10, wherein the clock division block generates the first internal clock and the second internal clock having the first phase difference at which active sections of the first internal clock and the second internal clock overlap with each other by dividing the phase of the source clock at the predetermined rate, and a first internal clock and a second internal clock having a second phase difference at which active sections of the first internal clock and the second internal clock do not overlap with each other by dividing the phase of the source clock at the predetermined rate in a normal operation section.

12. The semiconductor system of claim 11, wherein the clock division block includes:
    a first preliminary clock generation unit for generating a first preliminary clock where first and second edges are alternately generated starting from the first edge at every first edge of the source clock;
    a second preliminary clock generation unit for generating a second preliminary clock where second and first edges are alternately generated starting from the second edge at every first edge of the source clock;

a third preliminary clock generation unit for generating a third preliminary clock by shifting the first preliminary clock based on a timing in which the second edge of the source clock is generated;

a first internal clock output unit for outputting the first preliminary clock as the first internal clock in the phase detection operation section and the normal operation section; and a second internal clock output for outputting the third preliminary clock as the second internal clock in the phase detection operation section and the second preliminary clock as the second internal clock in the normal operation section.

13. The semiconductor system of claim 11, wherein the phase detection block is enabled in the phase detection operation section, and disabled in the normal operation section.

14. The semiconductor system of claim 11, wherein the first phase difference is a phase difference of approximately 90 degrees, and the second phase difference is a phase difference of approximately 180 degrees.

15. The semiconductor system of claim 11, wherein the predetermined rate is approximately ½, and a frequency of the source clock is twice as high as frequencies of the first and second internal clocks.

16. The semiconductor system of claim, the phase detection block includes:

a first phase detection unit for detecting the phase of the first internal clock at the predetermined edge of the strobe signal;

a second phase detection unit for detecting the phase of the second internal clock at the predetermined edge of the strobe signal; and a coupling unit for outputting the detection result information by performing an XOR operation on an output signal of the first phase detection unit and an output signal of the second phase detection unit.

17. The semiconductor system of claim 11, wherein the controller outputs with fixing the phase of the source clock in the phase detection operation section and the normal operation section, and outputs with varying the phase of the strobe signal adjusted in response to the detection result information in the phase detection operation section, and outputs with fixing the phase of the strobe signal in the normal operation section.

18. The semiconductor system of claim 11, wherein the controller outputs with fixing the phase of the strobe signal in the phase detection operation section and the normal operation section, and outputs with varying the phase of the source clock adjusted in response to the detection result information in the phase detection operation section, and outputs with fixing the phase of the source clock in the normal operation section.

19. A method of operating a semiconductor apparatus, the method comprising:

receiving a source clock and a strobe signal;

dividing, in a phase detection operation section, a phase of the source clock at a predetermined rate to generate a first internal clock and a second internal clock having a first phase difference at which active sections of the first internal clock and the second internal clock overlap with each other; and combining a result obtained by detecting a phase of the first internal clock at a predetermined edge of the strobe signal and a result obtained by detecting a phase of the second internal clock at the predetermined edge of the strobe signal to generate detection result information.

20. The method of claim 19, further comprising dividing, outside the phase detection operation section, a phase of the source clock at the predetermined rate to generate the first internal clock and the second internal clock having a second phase difference at which active sections of the first internal clock and the second internal clock do not overlap with each other.

\* \* \* \* \*